(12) United States Patent
Jang (10) Patent No.: US 7,064,387 B2
(45) Date of Patent: Jun. 20, 2006

(54) SILICON-ON-INSULATOR (SOI) SUBSTRATE AND METHOD FOR MANUFACTURING THE SAME

(75) Inventor: Tae-Ho Jang, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 45 days.

(21) Appl. No.: 10/874,403

(22) Filed: Jun. 22, 2004

(65) Prior Publication Data
US 2004/0235273 A1 Nov. 25, 2004

Related U.S. Application Data

(62) Division of application No. 10/076,237, filed on Feb. 13, 2002, now Pat. No. 6,774,016.

(30) Foreign Application Priority Data
Feb. 19, 2001 (KR) .............................. 2001-08111

(51) Int. Cl.
*H01L 27/01* (2006.01)
*H01L 27/12* (2006.01)
*H01L 31/0392* (2006.01)

(52) U.S. Cl. .................... 257/347; 257/348; 257/349; 257/350; 257/351; 257/352; 257/353; 257/354; 438/423; 438/514; 438/517

(58) Field of Classification Search ........ 257/347–354; 438/423, 514, 517
See application file for complete search history.

(56) References Cited

U.S. PATENT DOCUMENTS

| | | | | |
|---|---|---|---|---|
| 5,240,512 A | * | 8/1993 | Pollack ..................... 148/33.3 |
| 5,410,172 A | * | 4/1995 | Koizumi et al. ............ 257/347 |
| 5,886,385 A | * | 3/1999 | Arisumi et al. ............. 257/347 |
| 5,918,151 A | | 6/1999 | Tachimori et al. .......... 438/766 |
| 5,930,643 A | | 7/1999 | Sadana et al. .............. 438/407 |
| 6,043,166 A | | 3/2000 | Roitman et al. ............ 438/766 |
| 6,046,476 A | * | 4/2000 | Morishita et al. ........... 257/347 |

(Continued)

FOREIGN PATENT DOCUMENTS

JP 04-067649 3/1992

(Continued)

OTHER PUBLICATIONS

English language abstract of Japanese Patent No. 04-067649.

(Continued)

*Primary Examiner*—Ida M. Soward
(74) *Attorney, Agent, or Firm*—Marger Johnson & McCollom, P.C.

(57) ABSTRACT

A silicon-on-insulator (SOI) substrate includes a silicon substrate including an active region defined by a field region that surrounds the active region for device isolation. The field region includes a first oxygen-ion-injected isolation region and a second oxygen-ion-injected isolation region. The first oxygen-ion-injected isolation region has a first thickness and is disposed under the active region, a center of the first oxygen-ion-injected isolation region being at a first depth from a top surface of the silicon substrate. The second oxygen-ion-injected isolation region has a second thickness that is greater than the first thickness, the second oxygen-ion-injected isolation region disposed at sides of the active region and formed from a ton surface of the silicon substrate, a center of the second oxygen-ion-injected region disposed at a second depth from the top surface of the silicon substrate.

12 Claims, 10 Drawing Sheets

U.S. PATENT DOCUMENTS

| | | | |
|---|---|---|---|
| 6,194,289 B1 * | 2/2001 | Lee | 438/450 |
| 6,225,674 B1 * | 5/2001 | Lim et al. | 257/506 |
| 6,232,201 B1 | 5/2001 | Yoshida et al. | 438/423 |
| 6,278,156 B1 * | 8/2001 | Kobayashi | 257/347 |
| 6,310,378 B1 * | 10/2001 | Letavic et al. | 257/347 |
| 6,314,021 B1 * | 11/2001 | Maeda et al. | 365/185.01 |
| 6,333,532 B1 | 12/2001 | Davari et al. | 257/361 |
| 6,340,829 B1 * | 1/2002 | Hirano et al. | 257/347 |
| 6,350,703 B1 | 2/2002 | Sakaguchi et al. | 438/766 |
| 6,432,798 B1 | 8/2002 | Liu et al. | 438/433 |
| 6,455,894 B1 * | 9/2002 | Matsumoto et al. | 257/347 |
| 6,538,286 B1 * | 3/2003 | Back | 257/349 |
| 6,621,123 B1 * | 9/2003 | Nakabayashi et al. | 257/347 |

FOREIGN PATENT DOCUMENTS

| | | | |
|---|---|---|---|
| JP | 07201982 A | * | 8/1995 |
| JP | 08-167646 | | 6/1996 |

OTHER PUBLICATIONS

English language abstract of Japanese Patent No. 08-167646.

* cited by examiner

SILICON-ON-INSULATOR (SOI) SUBSTRATE AND METHOD FOR MANUFACTURING THE SAME

This application is a divisional of U.S. patent application Ser. No. 10/076,237, filed on Feb. 13, 2002, now U.S. Pat. No. 6,774,016, which is herein incorporated by reference in its entirety.

BACKGROUND OF THE INVENTION

1. Field of the Invention

The present invention relates to a silicon-on-insulator (SOI) substrate and a method for manufacturing the same.

2. Description of the Related Art

As semiconductor devices become highly integrated, current leakage at a junction area undesirably increases the power consumption. Thus, it has become essential for the semiconductor industry to solve this current leakage problem in order to obtain high-speed and low-power semiconductor devices.

More particularly, as the channel length of a transistor decreases to a degree of 0.5 μm or less, leakage current and the junction capacitance of source and drains of a MOS transistor increase, resulting in an increase of the parasitic capacitance and the power consumption.

In order to overcome such problems, an SOI substrate has been developed to minimize the junction capacitance, the parasitic capacitance and the current leakage.

Various methods for manufacturing the SOI substrate have been known. Generally, two methods are widely used. One of the two methods is called a separation by implanted oxygen (SIMOX) method where oxygen atoms are injected to a predetermined depth of a silicon substrate so that the oxygen atoms penetrate into the predetermined depth of the inner portion of the substrate. Then, the substrate is annealed to manufacture an SOI substrate. In the other method, an insulating layer is formed on wafers. Then, two pre-fabricated wafers with an insulating layer are attached and planarized to form an SOI substrate.

The method of manufacturing an SOI substrate by the conventional SIMOX method and a method of forming an active region by this method will be described in detail with reference to attached FIGS. 1A–1D.

FIGS. 1A–1D are cross-sectional views for explaining a method of manufacturing an SOI substrate and an active region according to the conventional method. The active region is defined by, for example, shallow trench isolation (STI) regions.

Figure 1A:
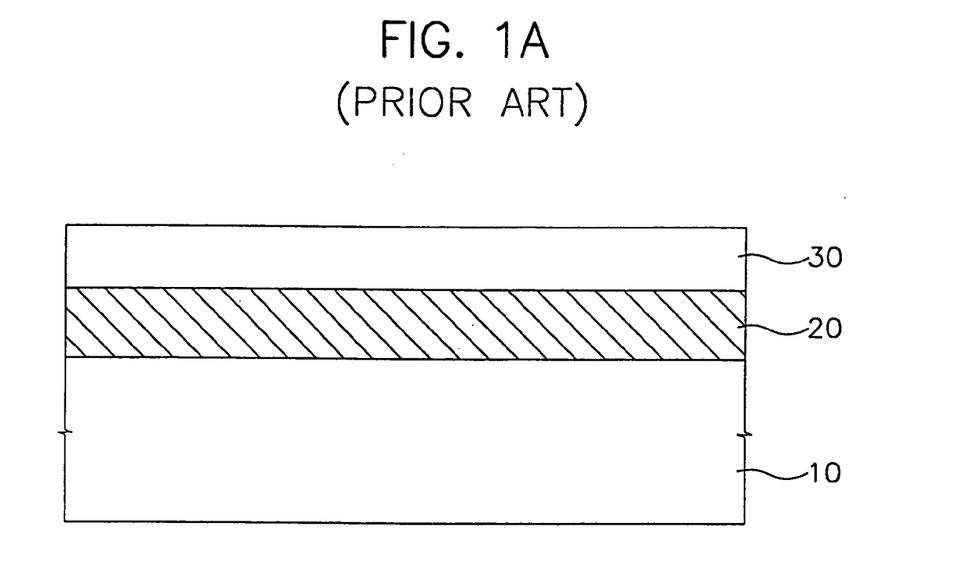
FIGS. 1A–1D are cross-sectional views for explaining a method of manufacturing an SOI substrate and an active region according to a conventional method.

Referring to FIG. 1A, a wafer is injected with oxygen ions and is heat-treated to form a buried oxide layer 20, thus forming an SOI substrate including a lower substrate 10, an oxide layer 20 and an SOI layer 30.

Figure 1B:
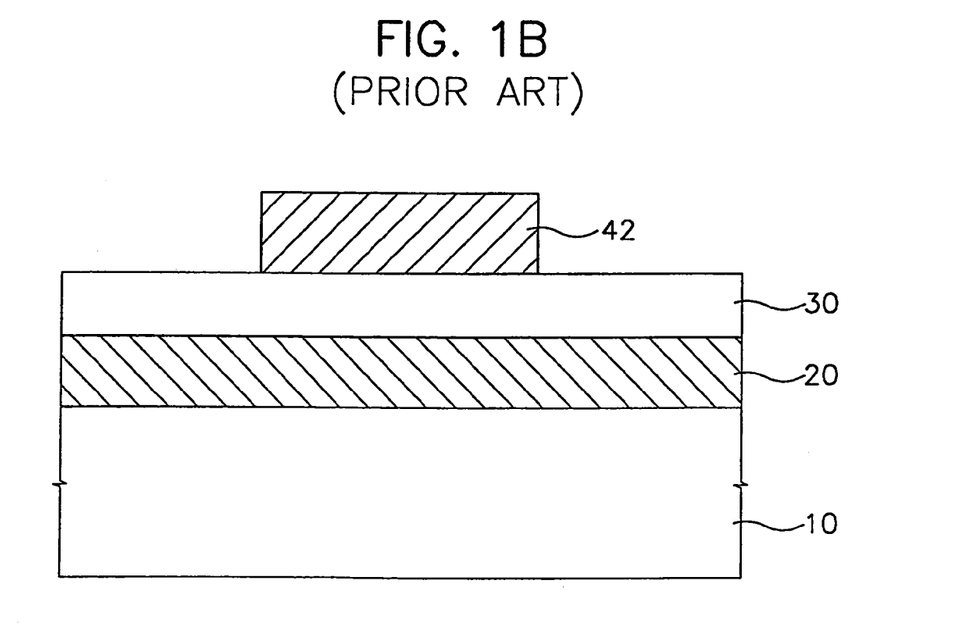

Referring to FIG. 1B, a photoresist is coated on the SOI layer 30 and then is dried to form a photoresist layer. Then, a conventional photo process is performed to form a photoresist pattern 42 in order to expose a surface of the substrate, where a field region is to be formed later.

Figure 1C:
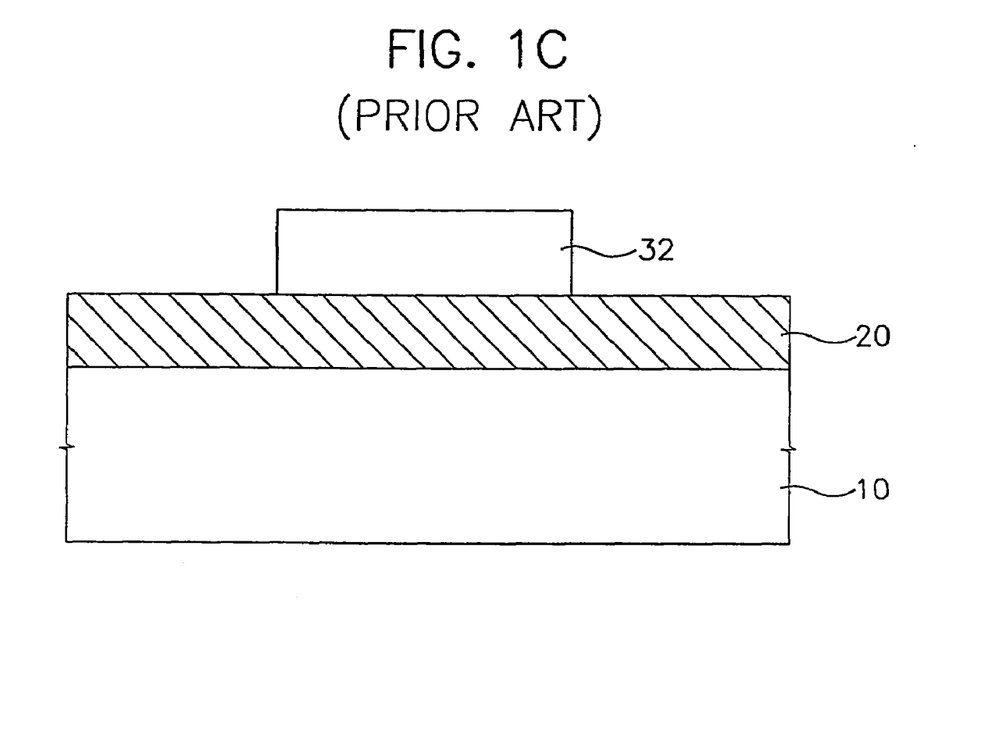

Referring to FIG. 1C, the SOI layer 30 is anisotropically etched, using the photoresist pattern 42 as an etching mask, to form an isolation trench for a field region 34 (FIG. 1D). Then, the photoresist pattern 42 is removed to expose an SOI layer pattern as an active region 32.

Figure 1D:
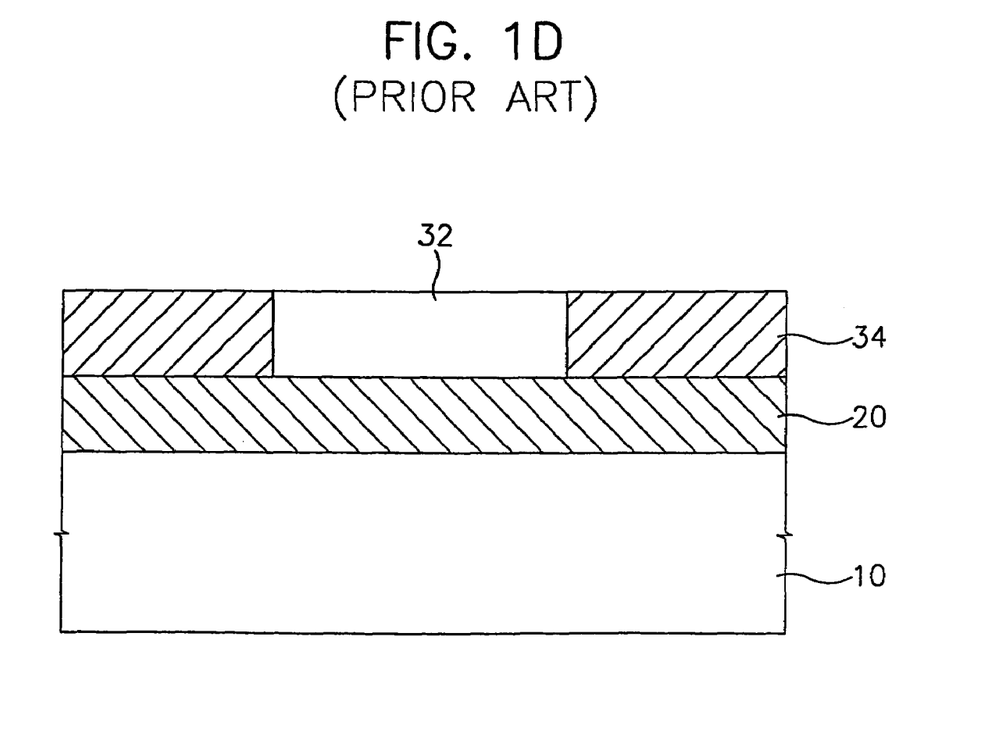

Referring to FIG. 1D, the field regions 34 defining the active region 32 are formed by filling the trench with an insulating material such as Undoped Silicate Glass (USG). Thereafter, a gate insulating layer and a gate electrode are formed on the active region 32 and source and drain regions are subsequently formed by ion implanation.

With the SOI substrate, the source and drain regions of the MOS transistor can be completely separated by field regions. Therefore, a junction capacitance and current leakage can be reduced and high-speed and lower-power-consumption semiconductor devices with improved insulation between the devices can be obtained.

Various methods for manufacturing an SOI substrate using SIMOX are disclosed as follows.

Japanese Patent Laid-Open Publication No. Hei 8-167646 discloses a method of manufacturing an SIMOX substrate having two or more single crystalline silicon thin films having different thicknesses. The SIMOX substrate is manufactured by injecting oxygen ions at a predetermined region of a single crystalline silicon substrate using a silicon oxide mask and subsequent heat-treatment at high temperatures.

Japanese Patent Laid-Open Publication No. Hei 4-67649 discloses a method of forming a device isolation region of an SOI substrate. According to this method, an insulating layer is formed on a semiconductor layer and then is patterned to form an insulating layer pattern. Thereafter, oxygen ions are implanted into the semiconductor layer, using the insulating layer pattern as a mask.

However, according to this method, a local oxidation of silicon (LOCOS) or other isolation trench structures should be formed to accomplish additional device isolation after implementing the oxygen ion injection and heat treatment to form the SOI substrate. Accordingly, the manufacturing process becomes complicated and costly.

On the other hand, according to the second method of manufacturing the SOI substrate, two wafers on which insulating layers are formed are attached using heat treatment and are then etched back. With this method, one wafer is removed through grinding and a high-temperature heat treatment is needed for the attachment of the wafers. Thus, voids might be formed at the contacting portion. In addition, the wafer grinding process is needed and thereby the process becomes complicated and costly.

SUMMARY OF THE INVENTION

The present invention contemplates a novel SOI substrate structure and an improved method for manufacturing the same. The SOI substrate in accordance with one embodiment of the present invention comprises a silicon substrate including an active region defined by a field region. The field region includes a first oxygen-ion-injected isolation region having a first thickness and being formed under the active region. The center of the first region is at a first depth from a top surface of the silicon substrate. The field region of the SOI substrate further includes a second oxygen-ion-injected region having a second thickness greater than the first thickness. The second region is formed at sides of the active region and is also formed from a top surface of the silicon substrate to a predetermined depth. The center of the second ion injected region is at a second depth from the top surface of the silicon substrate. The first and second ion injected regions surround the active region for device isolation. The SOI substrate is formed by performing two sequential ion injecting processes. Because the isolation of the active regions can be achieved by performing the ion injecting process using the sacrificial blocking layer pattern, active regions having various shapes can be obtained simply and less-costly.

According to one embodiment of the present invention, an SOI substrate is manufactured by using an SIMOX method.

The same mask can be used for performing two sequential oxygen ion injection processes with different process conditions. A heat treatment is then performed to complete an SOI substrate, in which an active region is separated or surrounded by a field region.

BRIEF DESCRIPTION OF THE DRAWINGS

The above object and advantages of the present invention will become more apparent by describing preferred embodiments in detail with reference to the attached drawings in which.

DESCRIPTION OF THE PREFERRED EMBODIMENT

The present invention will be explained in more detail with reference to the attached drawings below.

Figure 2:
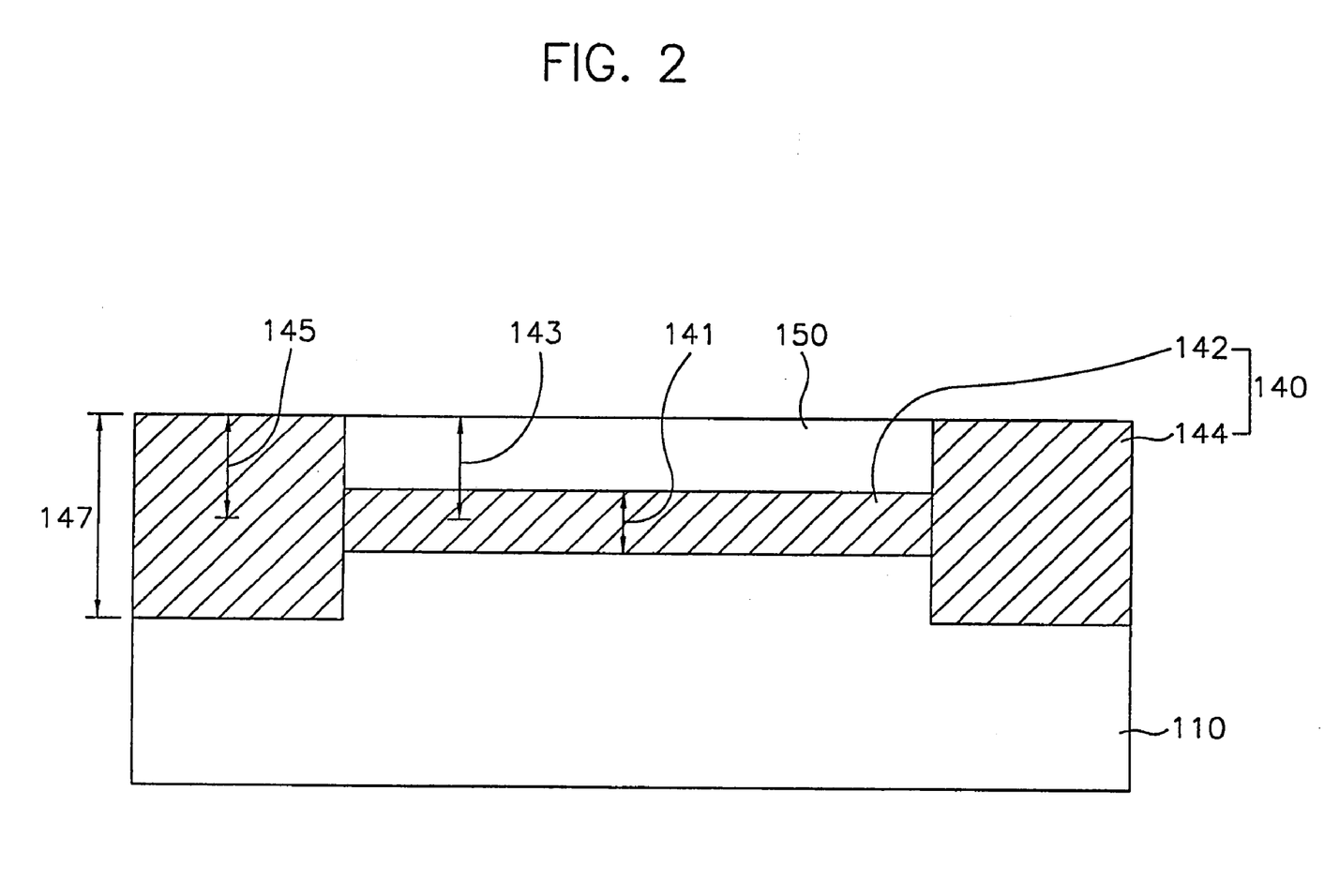
FIG. 2 is a cross-sectional view of an SOI substrate according to one embodiment of the present invention.

FIG. 2 is a cross-sectional view of an SOI substrate according to one embodiment of the present invention.

Referring to FIG. 2, an SOI substrate according to the present invention includes a lower silicon substrate 110, a field region 140 including a first oxygen-ion-injected isolation region 142 and a second oxygen-ion-injected isolation region 144, and an active region 150 formed on the first oxygen-ion-injected isolation region of the field region 140. As can be seen from FIG. 2, the surfaces of the active region 150 and of the field region 140 formed on the substrate 110 are co-planar.

The field region 140 includes the first oxygen ion injected isolation region 142 having the first thickness 141 and the second oxygen ion injected isolation-region 144 having the second thickness 147. The center of the first oxygen ion injected isolation region 142 is at the first depth 143 from the top surface of the substrate and the center of the second oxygen ion injected isolation region 144 is at the second depth 145 from the surface of the substrate. The first and second ion-injected-isolation regions 142 and 144 are symmetric along the center axis thereof, and the first thickness 141 is greater than the second thickness 147.

In FIG. 2, the depth and the thickness of each ion injected region and the thickness of the active region can be varied depending on the type and the critical dimension of the device. For example, the first and the second depth can be the same and are in a range of about 0.07–0.7 μm for a device having a critical dimension of 0.21 μm or less. For the device having the critical dimension of 0.21 μm or less, the second thickness is about 2–3.5 times of the first thickness. More preferably, the first thickness is in a range of about 0.04–0.6 μm and the second thickness is in a range of about 0.14–1.4 μm.

In the SOI substrate satisfying the above-described conditions, the center portions of the first and the second ion injected regions 142 and 144 are next to each other and accordingly, adjacent active regions 150 are separated from the side portion to the bottom portion by the insulating layer.

A method for manufacturing the SOI substrate will be described with reference to attached FIGS. 3A–3D. FIGS. 3A–3D are cross-sectional views for illustrating the method of manufacturing an SOI substrate according to one embodiment of the present invention.

Figure 3A:
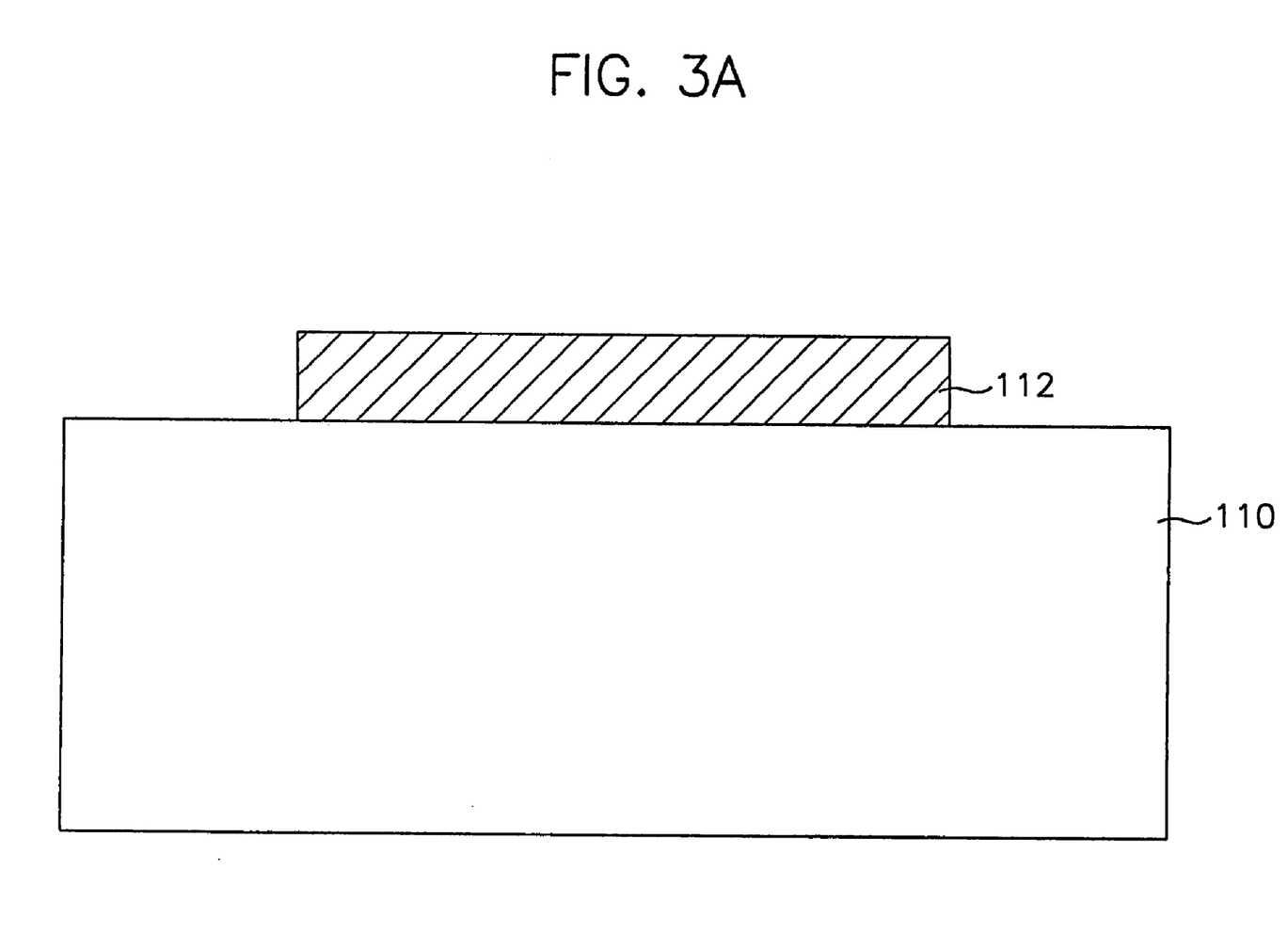
FIGS. 3A–3D are cross-sectional views for explaining a method of manufacturing an SOI substrate according to one embodiment of the present invention.

Referring to FIG. 3A, a photoresist layer is coated on a wafer 100 and is patterned to form a photoresist pattern 112 to define an active region 150. The photoresist pattern 112 is used as a sacrificial blocking layer for differentially injecting ions into the underlying wafer 100. For this, a layer having a high etching selectivity with respect to a silicon or silicon oxide layer, for example, a polyimide layer pattern, an SOG (spin-on-glass) layer pattern can be used besides the photoresist layer.

The sacrificial layer is formed to a predetermined thickness so that oxygen ions pass through the sacrificial layer during the first oxygen ion injecting process, while oxygen ions do not pass through the sacrificial layer during the second oxygen ion injecting process. Particularly, the thickness of the sacrificial layer is in a range of about 0.05–0.51 μm.

Figure 3B:
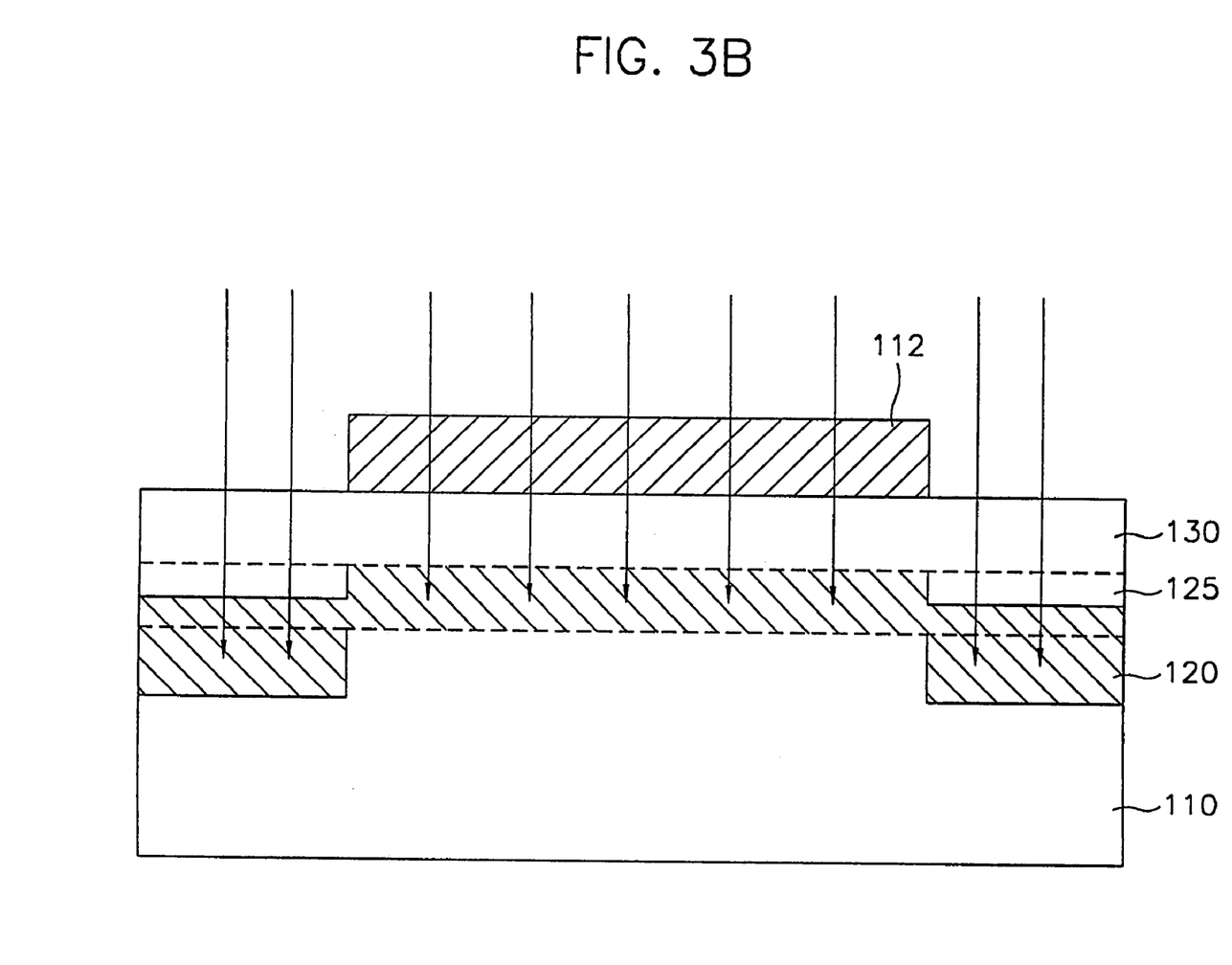

Referring to FIG. 3B, a first oxygen ion injecting process is implemented using the photoresist pattern 112 and an ion injector. The oxygen ions are injected into the wafer 100 as an impurity. However, the depths of ion injection are different depending on the presence or the absence of the photoresist pattern 112. That is, if a photoresist layer is formed on the entire surface of the wafer, an imaginary ion injected region 125 designated by dashed lines would be formed. However, if the photoresist pattern 112 is formed on a portion of the wafer, then two ion injected regions having a belt shape or the stepped bell shape are formed to different depths, as illustrated. That is, the ions injected into the photoresist pattern 112 are partially blocked by the photoresist pattern 112. Accordingly, a first ion injected region 120 is formed in the silicon substrate 110. An un-injected upper portion 130 of the silicon substrate is disposed over the first ion injected region 120, as shown in FIG. 3B.

The preferred process conditions for the first oxygen ion injecting process and for a device having a critical dimension of 0.21 μm are as follows. The ion injection is implemented with $32O_2^+$, at an energy range of about 60–80 KeV and at a first dose range of about $1\times10^{18}$–$8\times10^{18}$ $cm^2$. For a different device, different process conditions should be applied. For example, for a device having a dimension of about 0.14 μm or less, an ion injecting process is performed at an energy of about 60 KeV, which is less than the energy required for the device having a critical dimension of 0.21 μm, and at a dosage of about $1\times10^{18}$–$8\times10^{18}$ $cm^2$.

Figure 3C:
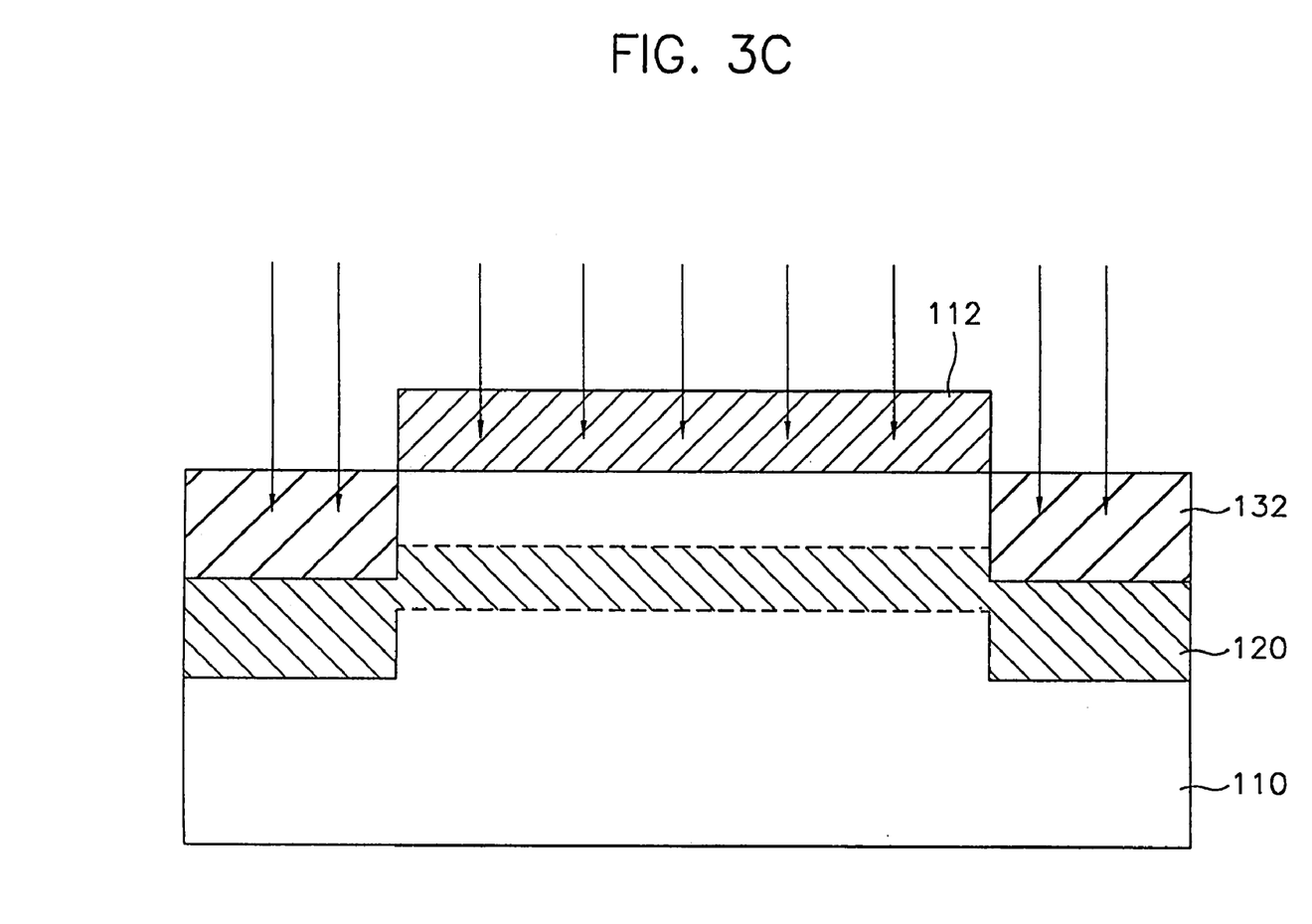

Referring to FIG. 3C, a second ion injecting process is implemented after completing the first ion injecting process in order to form device isolation layers, i.e., field regions, at the sides of the active region 150 and above the first ion injected region 120. The second ion injecting process is implemented with the sacrificial layer pattern 112 to form a second ion injected region 132 at the upper portion of the exposed substrate, on which the sacrificial layer pattern 112 is not formed, and above the first ion injected region 120. The second ion injecting process is implemented with less energy than the first ion injecting process in order to form the second ion injected region 132 above the first ion injected region 120. Thus, with the formation of the first and the second ion injected regions 120 and 132, a region without injected ions is formed at the upper portion of the substrate below the photoresist pattern 112.

In order to form the second ion injected region 132, ions are not injected into the upper portion of the substrate under the photoresist pattern 112, but are injected into the upper portion of the substrate where the photoresist pattern 112 is not formed. That is, the ions are blocked by the photoresist pattern 112 and injection of the ions into the substrate is prevented where the photoresist pattern 112 is formed, whereas the ions are injected into the upper portion of the substrate and above the first ion injected region 120 where the photoresist pattern 112 is not formed, as shown in FIG. 3C.

The second oxygen ion injecting process is preferably implemented with $32O_2^+$, at an energy range of less than 20 KeV and at a second dose range of about $1 \times 10^{18} – 8 \times 10^{18}$ cm$^2$. In addition, during the first and the second ion injecting processes, ions are injected perpendicular to the substrate. That is, the ion injecting angle is between approximately 0° and 10° during the first and second oxygen ion injecting processes.

Figure 3D:
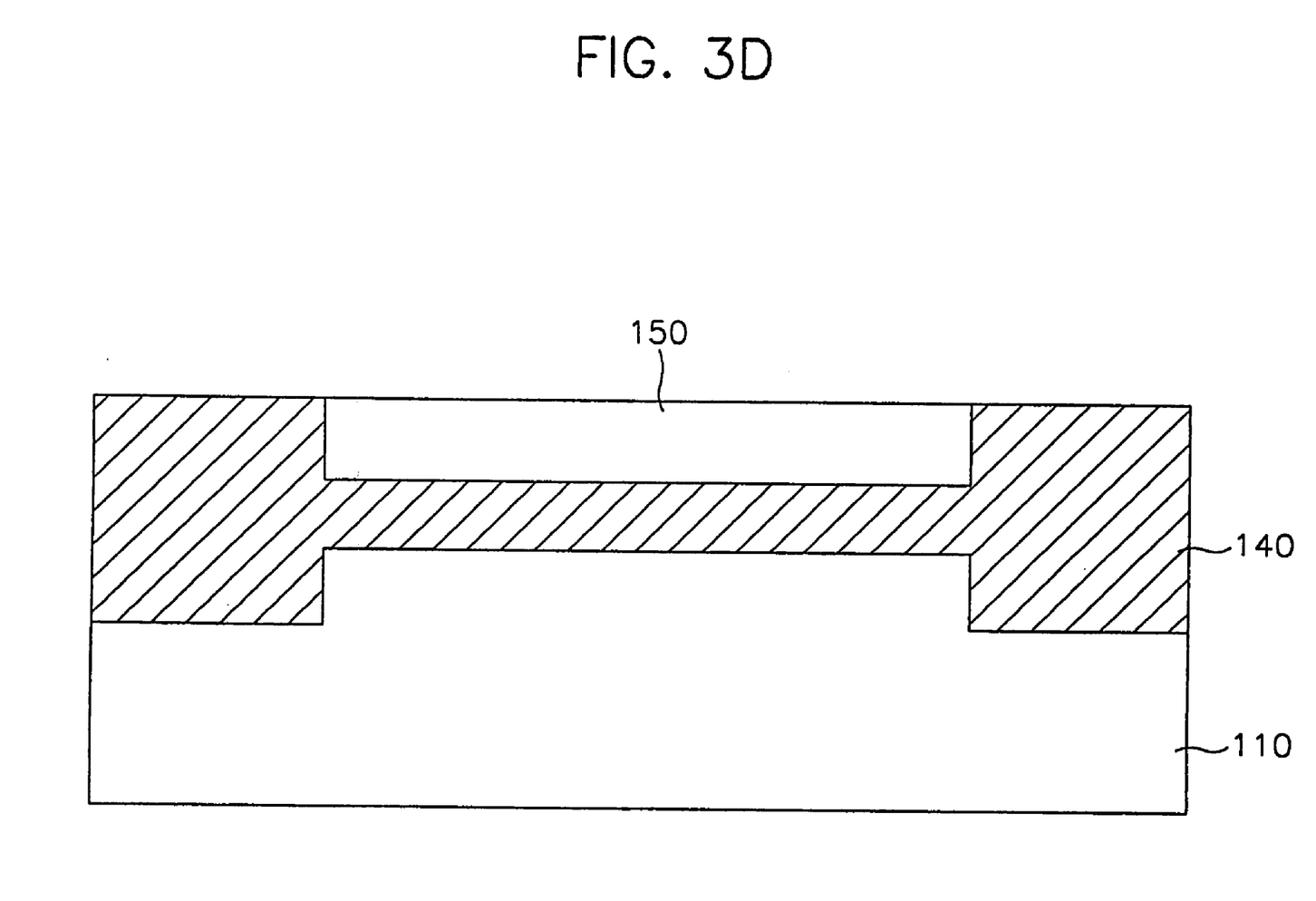

Referring to FIG. 3D, the photoresist pattern 112 is removed after the first and second ion injecting processes. Then, a heat treatment is implemented under an oxidizing atmosphere to from a buried oxide layer at the lower silicon substrate 110. Accordingly, an SOI substrate including a field region 140 and an active region 150 formed above the field region 140 is manufactured.

The heat treatment is preferably implemented at a temperature range of about 1100–1300° C. for about 2–7 hours under an oxidizing atmosphere. The oxidizing atmosphere can be a mixture gas atmosphere of argon and oxygen.

Using the heat treatment, the impurity doped region changes into an insulating layer of oxide. In addition, the edge portions of the insulating layer become smooth because of diffusion. Particularly, since a stress of the wafer itself is concentrated on an interface and the stress is concentrated at the edge portions. Accordingly, the probability of generating leakage current at the edge portion increases. However, when the edge portions become smooth through the heat treatment, the leakage current can be advantageously prevented.

Figure 4:
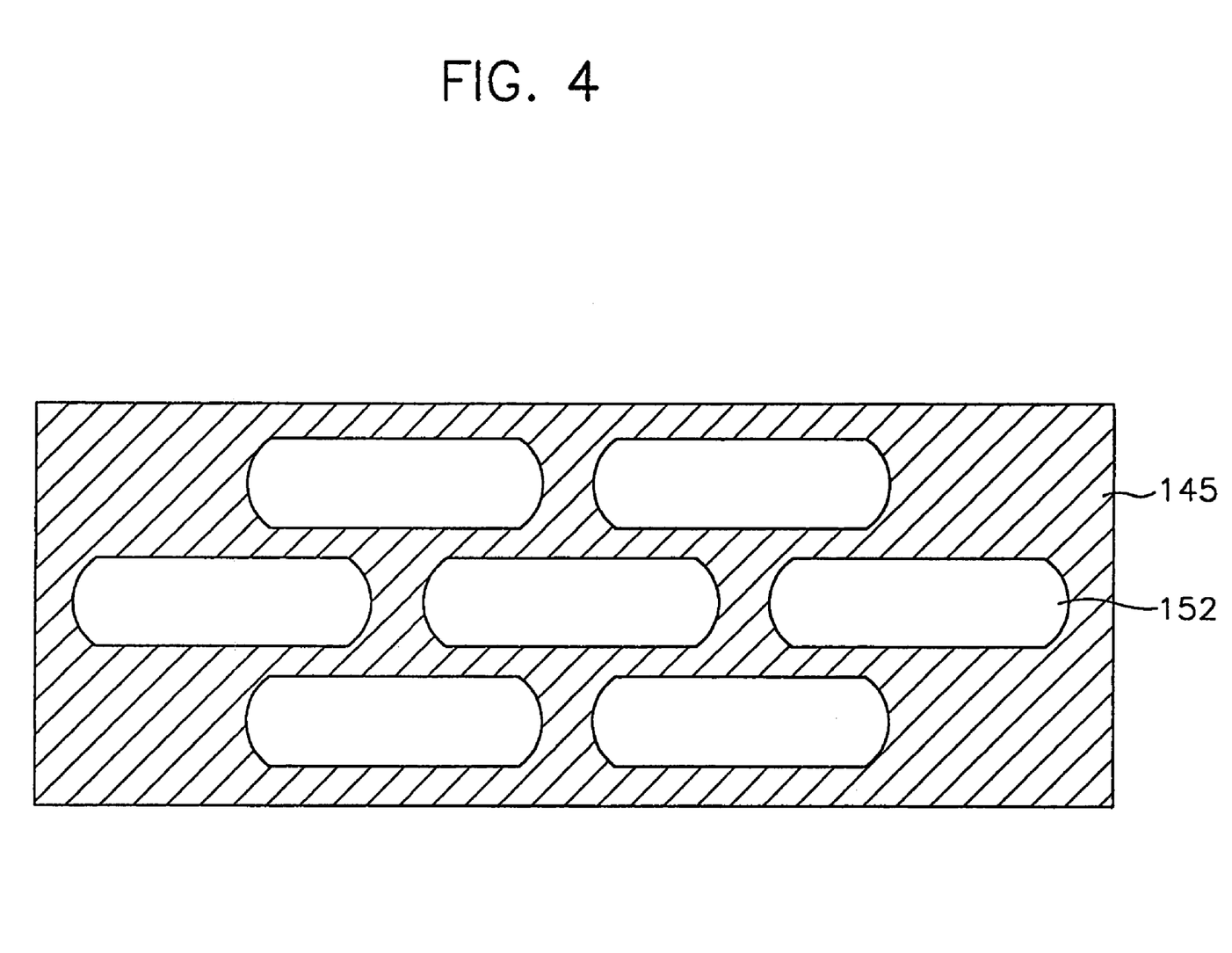
FIG. 4 is a top view illustrating an active region and a field region in an SOI substrate according to a first embodiment of the present invention.

FIG. 4 is a top view illustrating an active region and a field region in an SOI substrate according to a first embodiment of the present invention. As known from FIG. 4, the side portions and the bottom portion of each active region 152 are completely separated from each other by the filed region 145.

On the active region 152 of the SOI substrate, a gate insulating layer, a gate electrode, and source/drain regions are subsequently formed to form a MOS transistor on the SOI substrate.

Figure 5:
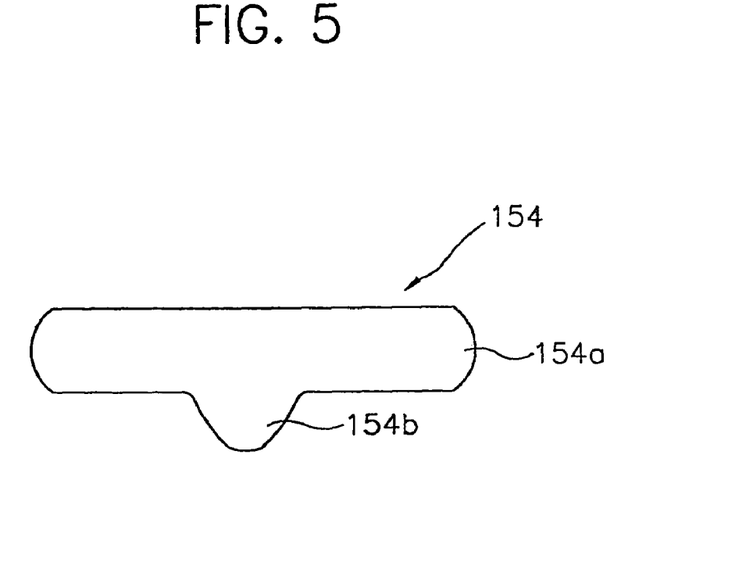
FIG. 5 is a top view illustrating an active region in an SOI substrate manufactured by a second embodiment of the present invention.
Figure 6:
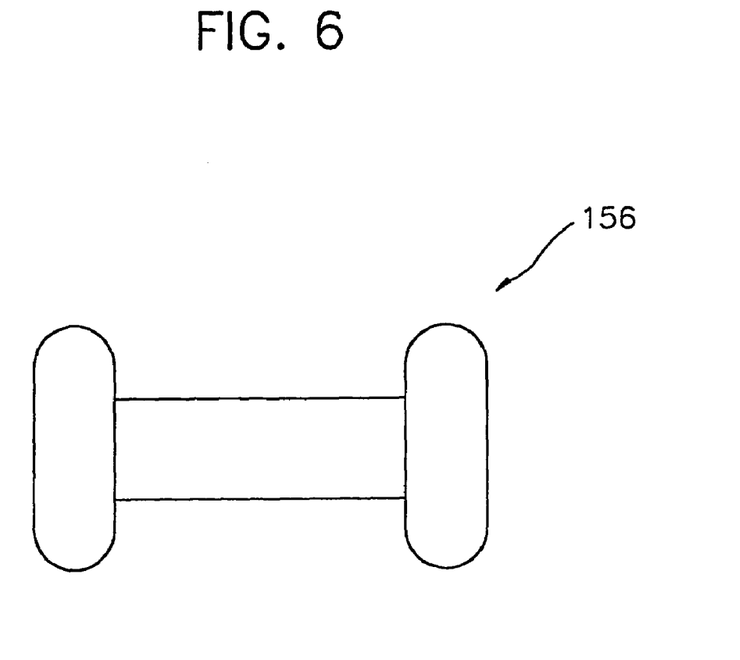
FIG. 6 is a top view illustrating an active region in an SOI substrate manufactured by a third embodiment of the present invention.

FIG. 5 is a top view illustrating an active region in an SOI substrate manufactured by a second embodiment of the present invention and FIG. 6 is a top view illustrating an active region in an SOI substrate manufactured by a third embodiment of the present invention. According to the present invention, the shape of the active region can be advantageously modified by changing the shape of the sacrificial layer pattern. For example, an active region 154 including a main portion 154a and a projected portion 154b as illustrated in FIG. 5 can be obtained. Otherwise, an active region 156 including projected portions at the side portions as illustrated in FIG. 6 can be obtained.

In order to manufacture a circuit on which highly integrated chips are manufactured, periphery circuits of various shapes should be manufactured. For the manufacture of the periphery circuits, active regions having various shapes are required. According to the present invention, active regions having various shapes can be advantageously manufactured by simply changing the shape of the mask pattern.

Figure 7:
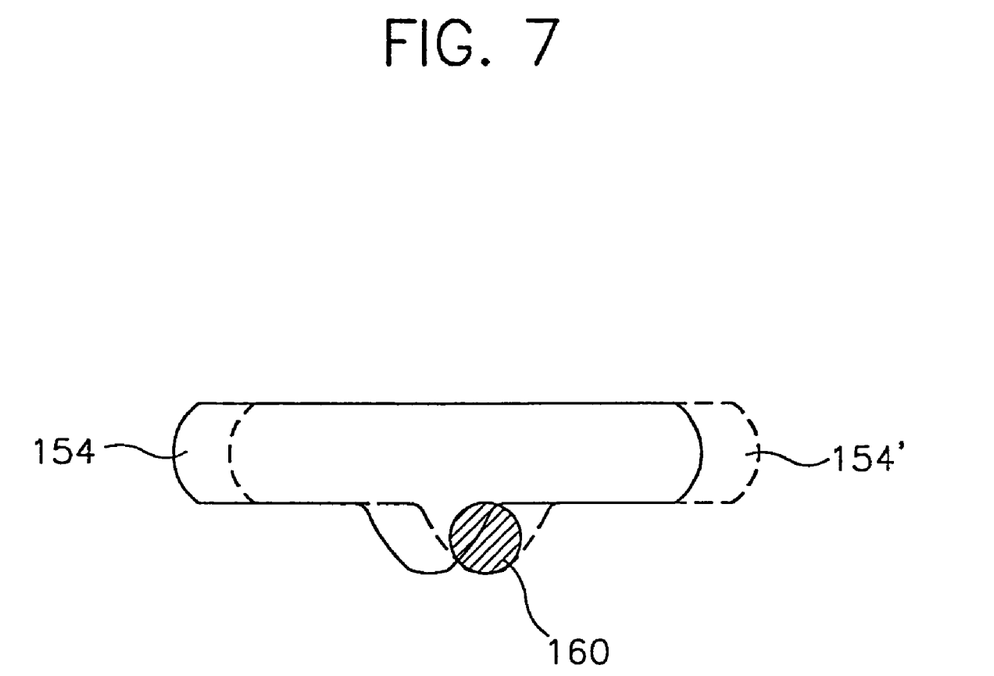
FIG. 7 is a top view illustrating an active region illustrated in FIG. 5, for explaining an effect of the present invention.

FIG. 7 is a top view illustrating an active region illustrated in FIG. 5, for explaining an effect of the present invention. An advantage obtainable when manufacturing the active region 154 through the method of the present invention will be described with reference to FIG. 7. A DRAM device will be exemplified.

A plurality of gate electrodes and bit lines are formed for the manufacture of the DRAM device. A direct contact hole is formed for the connection of the bit line with an impurity doped region of the gate electrode and a plurality of buried contact holes are formed for the connection of the impurity doped region of the gate electrode with a capacitor between the direct contact holes. At this time, as the integration degree of a device is heightened and the critical dimension of the device becomes narrow, a separate region such as the projected portion of the active region as illustrated in FIG. 7 might be formed considering a problem of interference with neighboring buried contact hole.

If the active region having the above-described shape is formed through a plurality of process steps according to the conventional method, it can be undesirably shifted to the region designated by 154' in FIG. 7. If a direct contact hole 160 is formed at the shifted active region, a contact region is reduced, resulting in an increase of resistance. However, according to the present invention, an active region is formed through two sequential ion injecting processing steps and thus the shifting of the active region does not occur.

As described above, an SOI substrate can be simply manufactured by injecting oxygen ions at a predetermined depth of a wafer followed by heat-treatment according to the present invention.

While the present invention is described in detail referring to the attached embodiments, various modifications, alternate constructions and equivalents may be employed without departing from the true spirit and scope of the present invention.

What is claimed is:

1. A silicon-on-insulator (SOI) substrate comprising:
   a silicon substrate having a field region that surrounds and defines an active region, the field region including
   a first oxygen-ion-injected isolation region disposed under the active region and having a first thickness, the first thickness substantially uniform throughout the first oxygen-ion-injected isolation region, a center of the first oxygen-ion-injected isolation region located at a first depth from a top surface of the silicon substrate; and
   a second oxygen-ion-injected isolation region disposed adjacent to the active region and the first oxygen-ion-injected isolation region, the second oxygen-ion-injected isolation region extending to a top surface of the silicon substrate, the second oxygen-ion-injected isolation region having a second thickness that is greater than the first thickness, a center of the second oxygen-ion-injected isolation region located at a second depth from the top surface of the silicon substrate.

2. The SOI substrate of claim 1, wherein a top surface of the active region and the top surface of the second oxygen-ion-injected isolation region are co-planar.

3. The SOI substrate of claim 1, the first depth substantially the same as the second depth.

4. The SOI substrate of claim 1, the first depth and the second depth are in a range of about 0.07 μm to about 0.7 μm.

5. The SOI substrate of claim 1, the second thickness about 2 to about 3.5 times greater than the first thickness.

6. The SOI substrate of claim 1, the first thickness about 0.04 μm to about 0.6 μm, and the second thickness about 0.14 to about 1.4 μm.

7. A silicon-on-insulator (SOI) substrate, the SOI substrate comprising:
   a silicon substrate including an active region defined by a field region, the field region including:
   a first oxygen-ion-injected isolation region having a first thickness and disposed under the active region, a center of the first oxygen-ion-injected isolation region located at a first depth from a top surface of the silicon substrate; and
   a second oxygen-ion-injected isolation region having a second thickness that is greater than the first thickness, the second oxygen-ion-injected isolation region disposed at sides of the active region and formed from a top surface of the silicon substrate, a center of the second region located at a second depth from the top surface of the silicon substrate,
   wherein the first and second oxygen-ion-injected regions surround the active region for device isolation, and wherein the first depth and the second depth are in a range of about 0.07 μm to about 0.7 μm.

8. The SOI substrate of claim 7, wherein a top surface of the active region and a top surface of the second oxygen-ion-injected isolation region are co-planar.

9. The SOI substrate of claim 7, the first depth and the second depth substantially the same.

10. The SOI substrate of claim 7, the second thickness about 2 to about 3.5 times greater than the first thickness.

11. The SOI substrate of claim 7, the first thickness about 0.04 μm to about 0.6 μm, the second thickness about 0.14 μm to about 1.4 μm.

12. The SOI substrate of claim 1, the field region substantially dumbbell-shaped.

* * * * *

UNITED STATES PATENT AND TRADEMARK OFFICE
CERTIFICATE OF CORRECTION

PATENT NO. : 7,064,387 B2
APPLICATION NO. : 10/874403
DATED : June 20, 2006
INVENTOR(S) : Tae-Ho Jang It is certified that error appears in the above-identified patent and that said Letters Patent is hereby corrected as shown below:

Column 4, line 28, the words "0.05-0.51" should read -- 0.05-0.5 --.

Signed and Sealed this

Eleventh Day of August, 2009

David J. Kappos
*Director of the United States Patent and Trademark Office*